(12) United States Patent
Kang et al.

(10) Patent No.: US 9,299,659 B2
(45) Date of Patent: Mar. 29, 2016

(54) SEMICONDUCTOR DEVICES INCLUDING MULTIPLE INTERCONNECTION STRUCTURES

(71) Applicant: Samsung Electronics Co., Ltd., Suwon-si, Gyeonggi-do (KR)

(72) Inventors: Jun-Gu Kang, Suwon-si (KR); OhKyum Kwon, Suwon-si (KR); Sun-Hyun Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/273,272

(22) Filed: May 8, 2014

(65) Prior Publication Data

US 2015/0048512 A1  Feb. 19, 2015

(30) Foreign Application Priority Data

Aug. 19, 2013  (KR) .................. 10-2013-0098094

(51) Int. Cl.
| | | |
|---|---|---|
| H01L 23/52 | (2006.01) | |
| H01L 23/528 | (2006.01) | |
| H01L 23/535 | (2006.01) | |
| H01L 21/768 | (2006.01) | |
| H01L 23/532 | (2006.01) | |

(52) U.S. Cl.
CPC ...... H01L 23/5283 (2013.01); H01L 21/76808 (2013.01); H01L 21/76838 (2013.01); H01L 21/76877 (2013.01); H01L 23/53295 (2013.01); H01L 2924/0002 (2013.01)

(58) Field of Classification Search
CPC .................................. H01L 23/5283
USPC .......................................... 257/774
See application file for complete search history.

(56) References Cited

U.S. PATENT DOCUMENTS

| 6,404,026 B2 * | 6/2002 | Tsuyuki .......... H01L 21/823871 257/127 |
|---|---|---|
| 6,593,654 B2 | 7/2003 | Oyamatsu |
| 7,202,157 B2 | 4/2007 | Ahn |
| 7,939,913 B2 | 5/2011 | Watanabe et al. |
| 2006/0097397 A1 | 5/2006 | Russell |
| 2006/0281298 A1 * | 12/2006 | Noguchi et al. .............. 438/622 |
| 2008/0136043 A1 * | 6/2008 | Ohtake et al. ................. 257/774 |
| 2013/0020679 A1 * | 1/2013 | Nagai ........................... 257/532 |

FOREIGN PATENT DOCUMENTS

| JP | 2012-212821 A | 11/2012 |
|---|---|---|
| KR | 2001-0027688 A | 4/2001 |
| KR | 10-1044612 B1 | 6/2011 |

* cited by examiner

*Primary Examiner* — Victor A Mandala
*Assistant Examiner* — Regan J Rundio
(74) *Attorney, Agent, or Firm* — Myers Bigel & Sibley, P.A.

(57) ABSTRACT

A semiconductor device is manufactured by forming a lower structure on a substrate including first and second regions, simultaneously forming a first interconnection on the lower structure of the first region and a first portion of a second interconnection on the lower structure of the second region, forming a first interlayer insulating layer on the first interconnection and on the first portion of the second interconnection, forming a trench exposing a top surface of the first portion of the second interconnection in the first interlayer insulating layer, and forming a second portion of the second interconnection in the trench. Related structures are also disclosed.

5 Claims, 19 Drawing Sheets

SEMICONDUCTOR DEVICES INCLUDING MULTIPLE INTERCONNECTION STRUCTURES

CROSS-REFERENCE TO RELATED APPLICATION

This U.S. non-provisional patent application claims priority under 35 U.S.C. §119 to Korean Patent Application No. 10-2013-0098094, filed on Aug. 19, 2013, in the Korean Intellectual Property Office, the disclosure of which is hereby incorporated by reference in its entirety.

BACKGROUND

The inventive concepts relate to semiconductor devices and methods of manufacturing the same and, more particularly, to semiconductor devices including interconnection structures and methods of manufacturing the same.

Semiconductor devices are very attractive in the electronics industry because of their small size, multi-function and/or low manufacturing costs. Semiconductor devices can be categorized as semiconductor memory devices storing data, semiconductor logic devices processing logical operations, hybrid semiconductor devices having both the function of the semiconductor memory devices and the function of the semiconductor logic devices and/or other integrated circuit devices.

Highly integrated semiconductor devices may allow high speed and/or low voltage/power consumption. Reliability of the semiconductor devices may be deteriorated by the high integration of the semiconductor devices. However, semiconductor devices having excellent reliability have been demanded with the development of the electronic industry. Thus, various research is being conducted for improving reliability of semiconductor devices.

SUMMARY

Embodiments of the inventive concepts may provide semiconductor devices that can have excellent reliability and methods of manufacturing the same.

Embodiments of the inventive concepts may also provide semiconductor devices capable of simplifying their manufacturing processes and methods of manufacturing the same.

In one aspect, a method of manufacturing a semiconductor device may include: forming a lower structure on a substrate including a first region and a second region; simultaneously forming a first interconnection on the lower structure of the first region and a first portion of a second interconnection on the lower structure of the second region; forming a first interlayer insulating layer on the first interconnection and on the first portion of the second interconnection; forming a trench exposing a top surface of the first portion of the second interconnection in the first interlayer insulating layer; and forming a second portion of the second interconnection in the trench.

In some embodiments, the method may further include: simultaneously forming a first contact electrically connecting the lower structure to the first interconnection in the first region and a second contact electrically connecting the lower structure to the first portion of the second interconnection in the second region.

In some embodiments, the first contact and the first interconnection may be formed to constitute one body without an interface therebetween, and the second contact and the first portion of the second interconnection may be formed to constitute one body without an interface therebetween.

In some embodiments, the first contact and the first interconnection may be formed at the same time, and the second contact and the first portion of the second interconnection may be formed at the same time.

In some embodiments, the method may further include forming a second interlayer insulating layer on the lower structure before forming the first interlayer insulating layer. Forming the first contact and the first interconnection may include: forming a first hole penetrating a lower portion of the second interlayer insulating layer in the first region, the first hole exposing the lower structure; and forming a first interconnection-trench penetrating an upper portion of the second interlayer insulating layer in the first region, the first interconnection-trench connected to the first hole. Forming the second contact and the first portion of the second interconnection may include: forming a second hole penetrating a lower portion of the second interlayer insulating layer in the second region, the second hole exposing the lower structure of the second region; and forming a second interconnection-trench penetrating an upper portion of the second interlayer insulating layer in the second region, the second interconnection-trench connected to the second hole. The first hole and the second hole may be formed at the same time, and the first interconnection-trench and the second interconnection-trench may be formed at the same time.

In some embodiments, forming the first contact, the first interconnection, the second contact and the first portion of the second interconnection may include: forming a conductive layer in the first hole, the first interconnection-trench, the second hole and the second interconnection-trench on the second interlayer insulating layer; and planarizing the conductive layer until the second interlayer insulating layer is exposed.

In some embodiments, the first interconnection and the first portion of the second interconnection may have linear shapes extending in a first direction and may be spaced apart from each other in a second direction intersecting the first direction, and the trench may have a linear shape extending along the top surface of the first portion of the second interconnection.

In some embodiments, forming the second portion of the second interconnection may include: forming a conductive layer in the trench on the first interlayer insulating layer; and planarizing the conductive layer until the first interlayer insulating layer is exposed.

In some embodiments, the first portion and the second portion may include the same material.

In some embodiments, a bottom surface of the first interconnection may be disposed at a substantially same height as a bottom surface of the second interconnection.

In some embodiments, a top surface of the first interconnection may be lower than a top surface of the second interconnection.

In another aspect, a semiconductor device may include: a substrate including a first region and a second region; a first interconnection on the substrate in the first region; and a second interconnection on the substrate in the second region. A bottom surface of the first interconnection may be disposed at a substantially same height as a bottom surface of the second interconnection, and a top surface of the second interconnection may be higher than a top surface of the first interconnection.

In yet another aspect, the semiconductor device may include a substrate, and a first interconnection structure and a second interconnection structure that both extend from adjacent the substrate to remote from the substrate. The first and second interconnection structures each include a first portion adjacent the substrate, a second portion remote from the substrate and an intermediate portion between the first and second portions. The intermediate portion of a respective interconnection structure is wider than the first and second portions thereof. The intermediate portion of the first interconnection structure is shorter than the intermediate portion of the second interconnection structure.

In some embodiments, the first and second interconnection structures have substantially same height. In some embodiments, the first interconnection structure is electrically connected to a first transistor and the second interconnection structure is electrically connected to a second transistor that operates at a higher voltage than the first transistor. In some embodiments, the first portions are of substantially same width as one another, the second portions are of substantially same width as one another and the intermediate portions are of substantially same width as one another.

In some embodiments, the first and second interconnection structures each further includes a lower interconnection structure that extends between the respective first portions and the substrate, the lower interconnection structures being of substantially same width as one another and of substantially same width as the intermediate portions, and of substantially same height as one another.

BRIEF DESCRIPTION OF THE DRAWINGS

The inventive concepts will become more apparent in view of the attached drawings and accompanying detailed description.

FIGS. 2A to 9A are plan views illustrating a method of manufacturing a semiconductor device according to example embodiments of the inventive concepts;

FIGS. 2B to 9B are cross-sectional views taken along lines I-I' of FIGS. 2A to 9A, respectively.

DETAILED DESCRIPTION OF THE EMBODIMENTS

Figure 1:
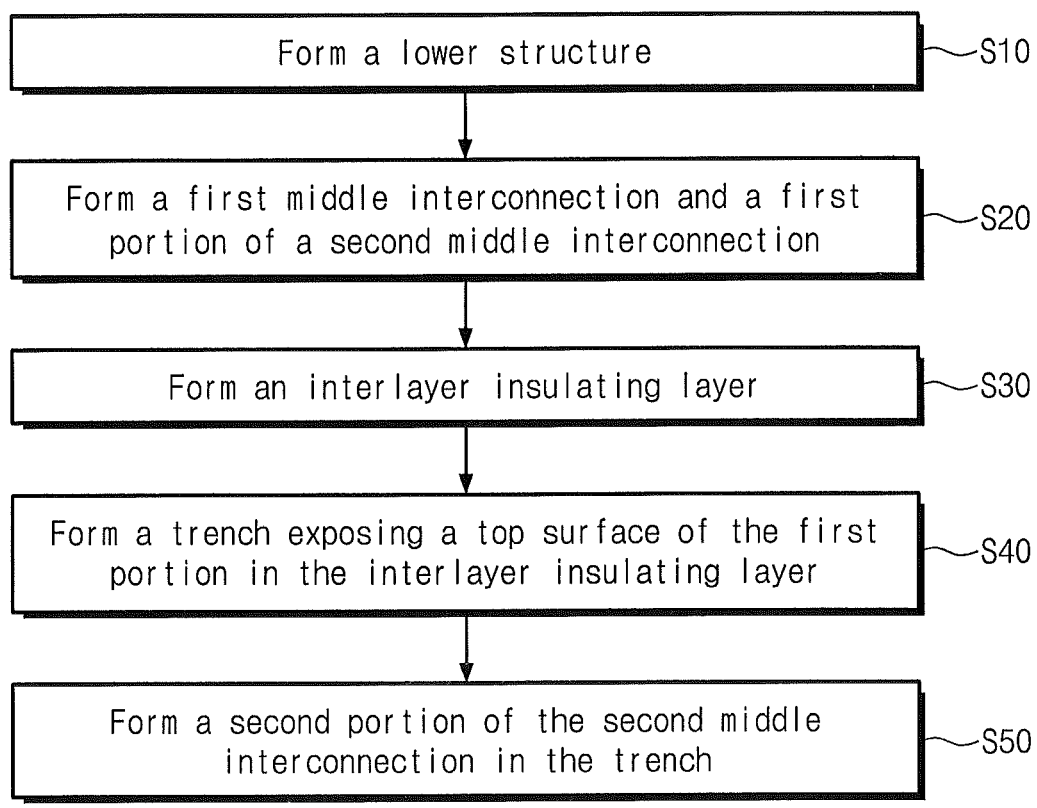
FIG. 1 is a flowchart illustrating a method of manufacturing a semiconductor device according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and the size and/or relative sizes of various regions may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal views of the inventive concepts. Accordingly, shapes of the views may be modified according to manufacturing techniques and/or allowable errors. Therefore, the embodiments of the inventive concepts are not limited to the specific shape illustrated in the views, but may include other shapes that may be created according to manufacturing processes. Areas exemplified in the drawings have general properties, and are used to illustrate specific shapes of elements. Thus, this should not be construed as limited to the scope of the inventive concepts, unless otherwise indicated herein.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, these embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments, unless otherwise indicated above.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

FIG. 1 is a flowchart illustrating a method of manufacturing a semiconductor device according to example embodiments of the inventive concepts. FIGS. 2A to 9A are plan views illustrating a method of manufacturing a semiconductor device according to example embodiments of the inventive concepts. FIGS. 2B to 9B are cross-sectional views taken along lines I-I' of FIGS. 2A to 9A, respectively.

Figure 2A:
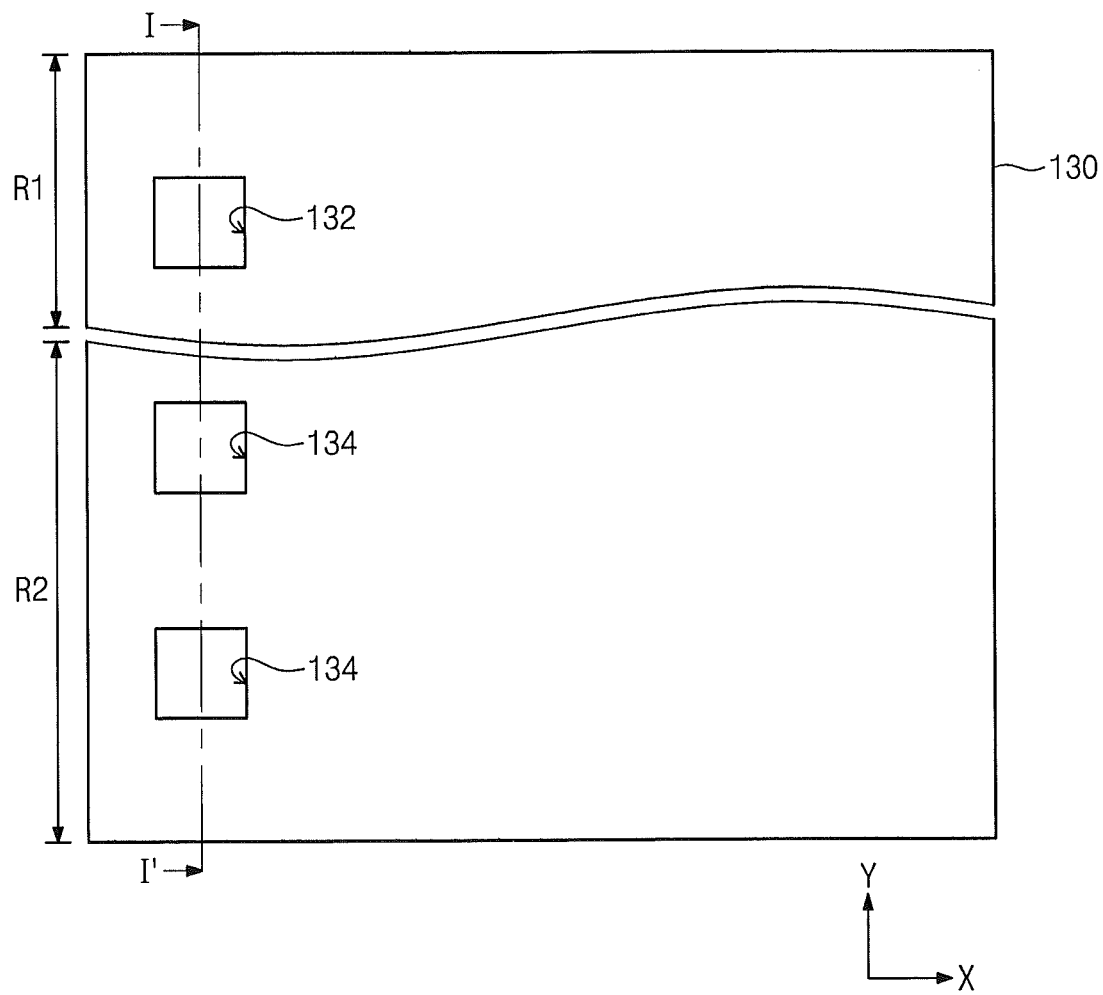
Figure 2B:
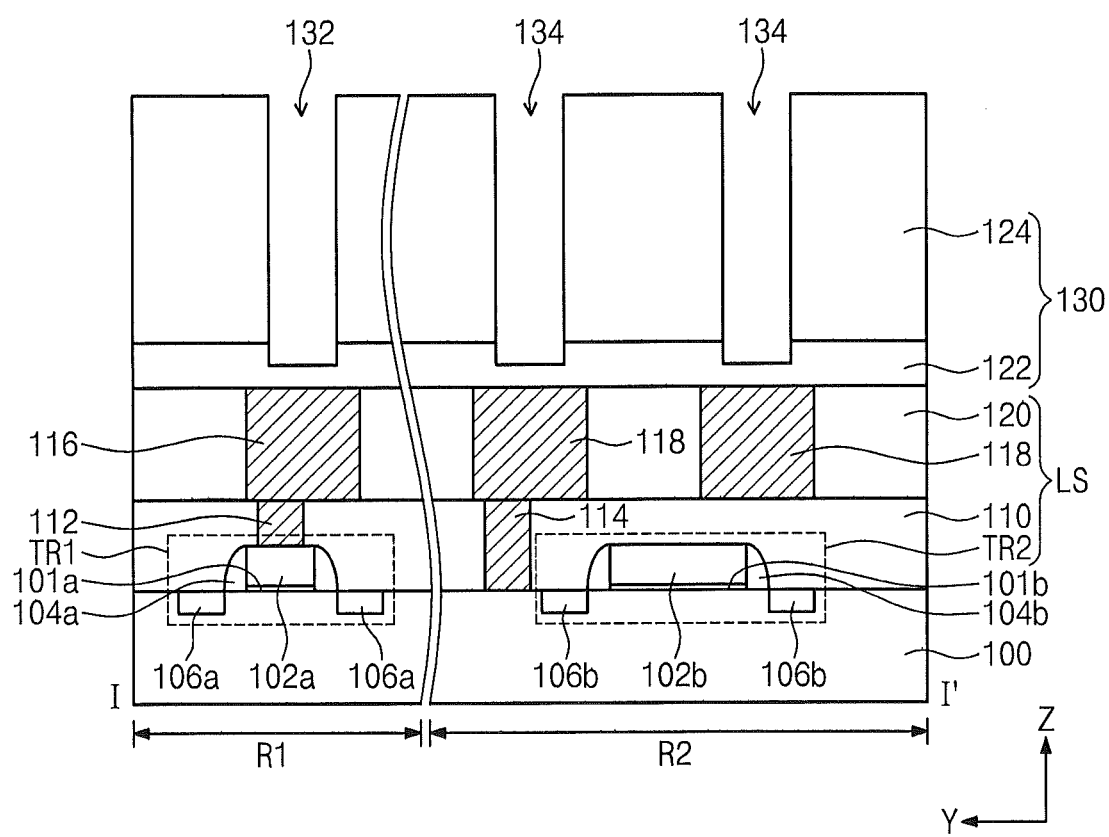

Referring to FIGS. 1, 2A and 2B, a lower structure LS may be formed on a substrate 100 (S10). The substrate 100 may include a first region R1 and a second region R2. Transistors driven by low driving voltage (or low power) may be formed in the first region R1. For example, the first region R1 may be a low voltage region. Transistors driven by relatively high driving voltage (or high power) may be formed in the second region R2. For example, the second region R2 may be a medium voltage region and/or a high voltage region. The lower structure LS may include transistors in/on the substrate 100, lower interconnections on the transistors, and lower contacts connecting the lower interconnections to the transistors and/or the substrate 100.

In more detail, the substrate 100 may be a semiconductor substrate, for example, a silicon substrate, a germanium substrate, or a silicon-germanium substrate. At least one first transistor TR1 may be formed on the substrate 100 of the first region R1. The first transistor TR1 may include a first gate electrode 102a on the substrate 100, a first gate dielectric pattern 101a between the substrate 100 and the first gate electrode 102a, first gate spacers 104a on both sidewalls of the first gate electrode 102a, and first source/drain regions 106a at both sides of the first gate electrode 102a. At least one second transistor TR2 may be formed on the substrate of the second region R2. The second transistor TR2 may include a second gate electrode 102b on the substrate 100, a second gate dielectric pattern 101b between the substrate 100 and the second gate electrode 102b, second gate spacers 104b on both sidewalls of the second gate electrode 102b, and second source/drain regions 106b at both sides of the second gate electrode 102b.

The second transistor TR2 may be formed independently of the first transistor TR1. However, the inventive concepts are not limited to the independently formation of the first and second transistors TR1 and TR2. The driving voltage (or power) of the first transistor TR1 may be lower than the driving voltage (or power) of the second transistor TR2.

According to some embodiments, a first lower insulating layer 110 may be formed on, and in some embodiments to cover, the first and second transistors TR1 and TR2 on the substrate 100. The first lower insulating layer 110 may include an oxide layer, a nitride layer, and/or an oxynitride layer. Thereafter, a first lower contact 112 and a second lower contact 114 may be formed to penetrate the first lower insulating layer 110. The first and second lower contacts 112 and 114 may be connected to the transistors TR1 and TR2 and/or the substrate 100. The first lower contact 112 may be formed in the first region R1 and the second lower contact 114 may be formed in the second region R2. The first and second lower contacts 112 and 114 may include a conductive material such as a metal.

A second lower insulating layer 120 may be formed on the first lower insulating layer 110. The second lower insulating layer 120 may include an oxide layer, a nitride layer, and/or an oxynitride layer. At least one first lower interconnection 116 and at least one second lower interconnection 118 may be formed in the second lower insulating layer 120. The first lower interconnection 116 may be connected to the first lower contact 112 in the first region R1, and the second lower interconnection 118 may be connected to the second lower contact 114 in the second region R2. The first and second lower interconnections 116 and 118 may include a conductive material such as a metal and may have linear shapes extending in one direction. The transistors TR1 and TR2, the lower contacts 112 and 114 and the lower interconnections 116 and 118 that are formed on the substrate 100 may be defined as the lower structure LS.

A first interlayer insulating layer 130 may be formed on the lower structure LS. The first interlayer insulating layer 130 may include a first etch stop layer 122 and a first mold layer 124 that are sequentially stacked on the lower structure LS. For example, the first etch stop layer 122 may include a silicon nitride layer such as a silicon-carbon nitride (SiCN) layer. The first mold layer 124 may include an oxide layer, a nitride layer, and/or an oxynitride layer. In some embodiments, the first mold layer 124 may include a SiCOH layer.

At least one first hole 132 and at least one second hole 134 may be formed to penetrate the first interlayer insulating layer 130 in the first region R1 and the second region R2, respectively. The first and second holes 132 and 134 may be arranged in a first direction (e.g., a Y-direction) to constitute one column when viewed from a plan view. However, the inventive concepts are not limited thereto.

The first and second holes 132 and 134 may be formed at the same time (i.e., simultaneously). In more detail, a mask pattern having openings may be formed on the first interlayer insulating layer 130. The openings of the mask pattern may define the first and second holes 132 and 134. The first interlayer insulating layer 130 may be etched using the mask pattern as an etch mask, thereby forming the first and second holes 132 and 134. In some embodiments, at least a portion of the first etch stop layer 122 exposed by the first and second holes 132 and 134 may not be etched but may remain. Thereafter, the mask pattern may be removed.

Figure 3A:
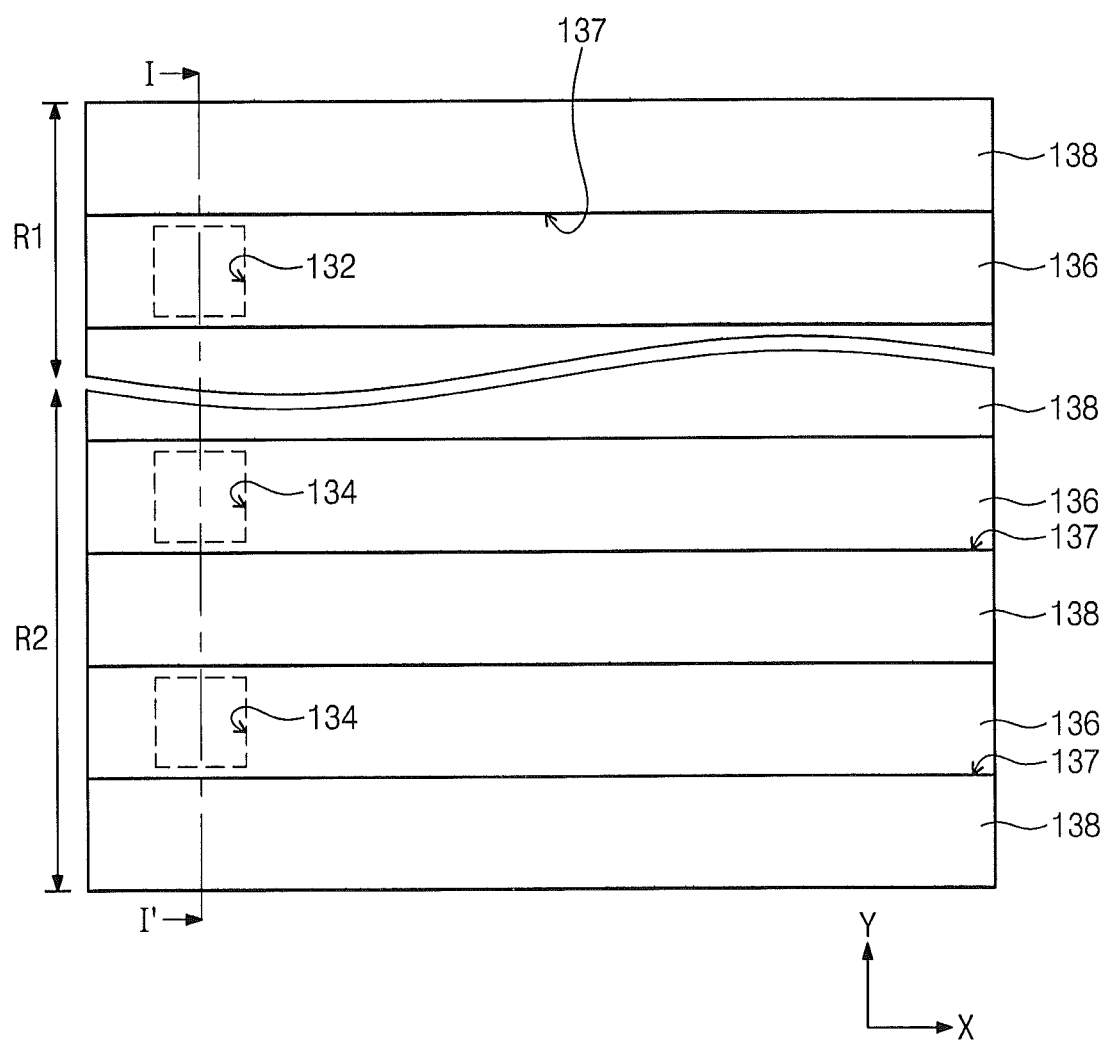
Figure 3B:
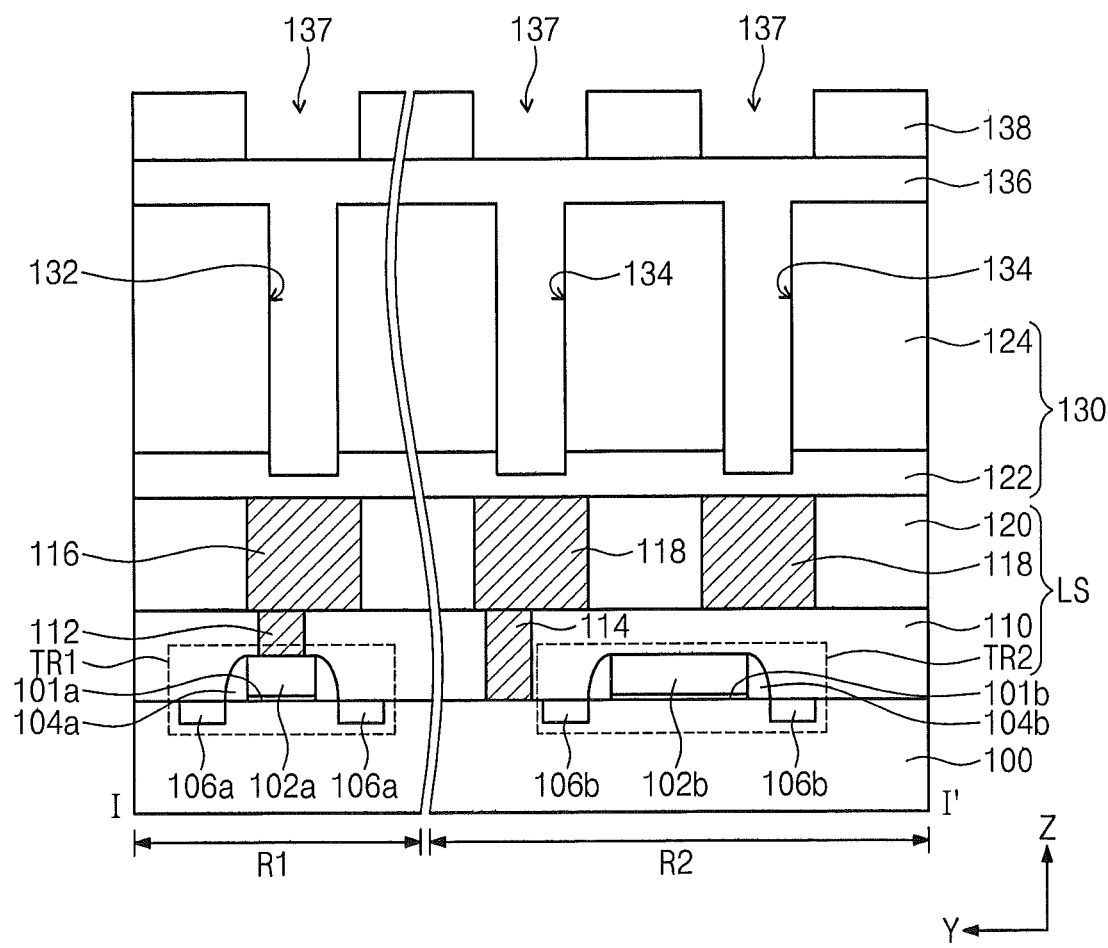

Referring to FIGS. 3A and 3B, a first mask layer 136 filling the first and second holes 132 and 134 may be formed on the first interlayer insulating layer 130. The first mask layer 136 may include a carbon-containing oxide layer (e.g., NFC). A first mask pattern 138 having first openings 137 may be formed on the first mask layer 136. The first openings 137 define interconnection-trenches that will be formed in a subsequent process. The first mask pattern 138 may be a hard mask pattern and/or a photoresist pattern. The first openings 137 may have linear shapes extending in a second direction (e.g., an X-direction) intersecting the first direction (e.g., the Y-direction) when viewed from a plan view. The first openings 137 may expose the first mask layer 136 on the first and second holes 132 and 134. In other words, the first openings 137 may vertically overlap with the first and second holes 132 and 134.

Figure 4A:
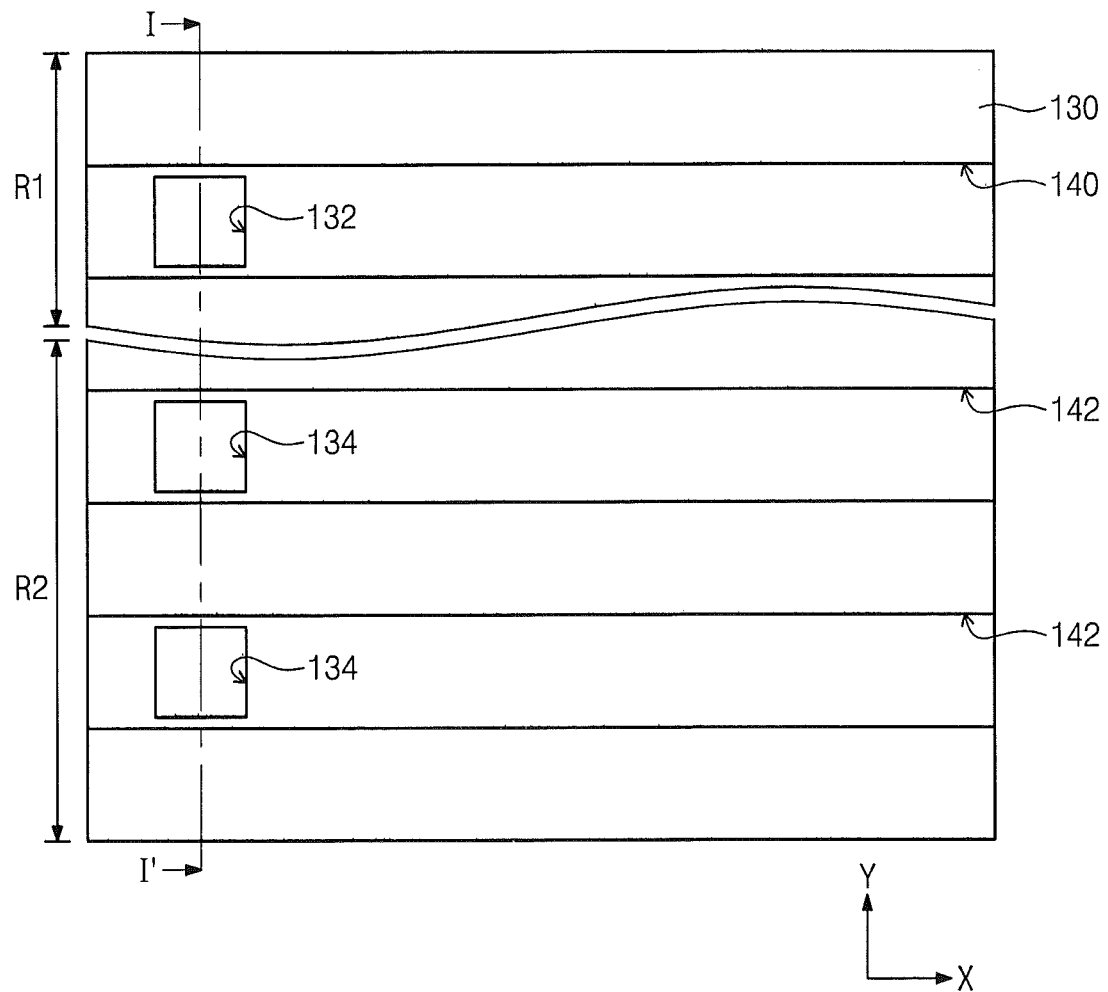
Figure 4B:
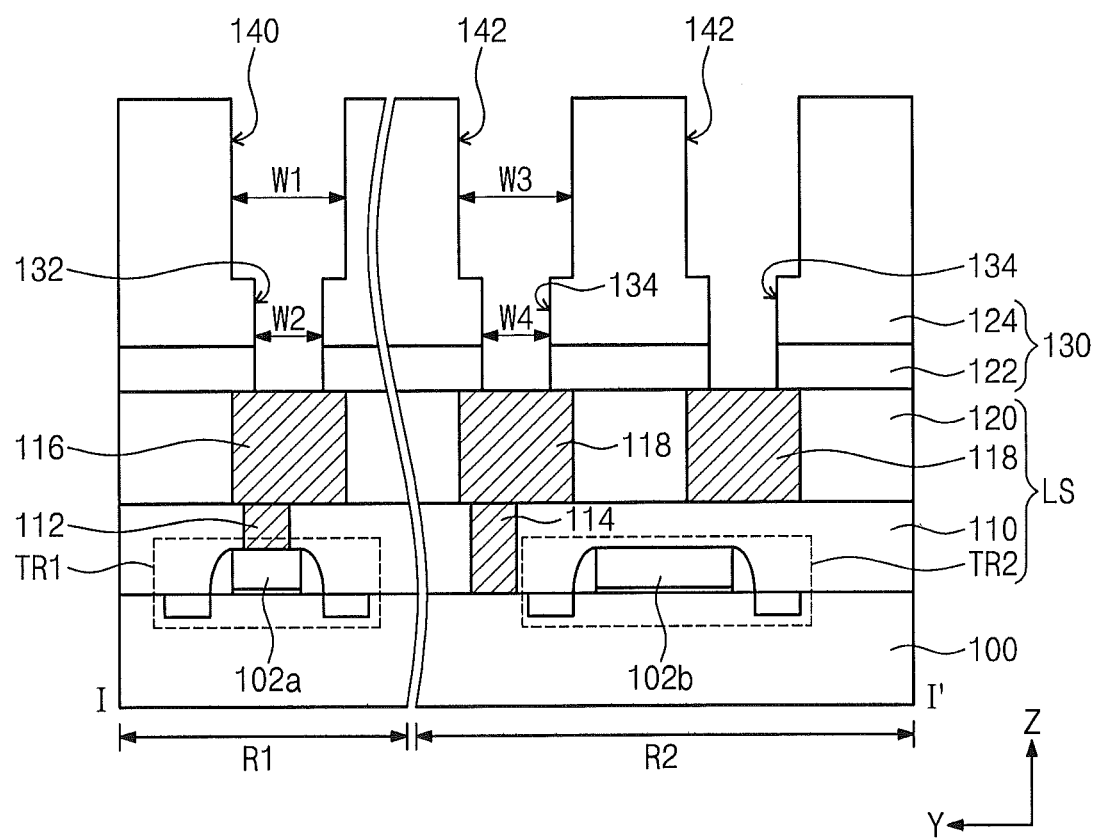

Referring to FIGS. 4A and 4B, the first mask layer 136 and the first mold layer 124 may be partially etched using the first mask pattern 138 as an etch mask, thereby forming at least one first interconnection-trench 140 in the first region R1 and at least one second interconnection-trench 142 in the second region R2 at the same time. The first and second interconnection-trenches 140 and 142 may have linear shapes extending in the second direction when viewed from a plan view. A bottom surface of the first interconnection-trench 140 may be connected to the first hole 132, and a bottom surface of the second interconnection-trench 142 may be connected to the second hole 134.

In some embodiments, the first mask layer 136 in the first and second holes 132 and 134 may be removed by the etching process for the formation of the interconnection-trenches 140 and 142. Alternatively, portions of the first mask layer 146 may remain in the first and second holes 132 and 134 after the etching process for the formation of the interconnection-trenches 140 and 142. The remaining portions of the first mask layer 136 in the holes 132 and 134 may be removed using a subsequent ashing process and/or a subsequent strip process. The portions of the first mold layer 124 exposed by the first openings 137 may be etched during the etching process for the formation of the interconnection-trenches 140 and 142. Thus, a first width W1 of the first interconnection-trench 140 may be greater than a second width W2 of the first hole 132, and a third width W3 of the second interconnection-trench 142 may be greater than a fourth width W4 of the second hole 134.

In some embodiments, the first etch stop layer 122 exposed by the first and second holes 132 and 134 may be removed during the etching process for the formation of the interconnection-trenches 140 and 142, thereby exposing top surfaces of the lower interconnections 116 and 118. However, in other embodiments, an additional etching process may be performed in order to remove the first etch stop layer 122 exposed by the first and second holes 132 and 134, thereby exposing the top surfaces of the lower interconnections 116 and 118. Subsequently, the first mask pattern 138 may be removed using an ashing process and/or a strip process.

Figure 5A:
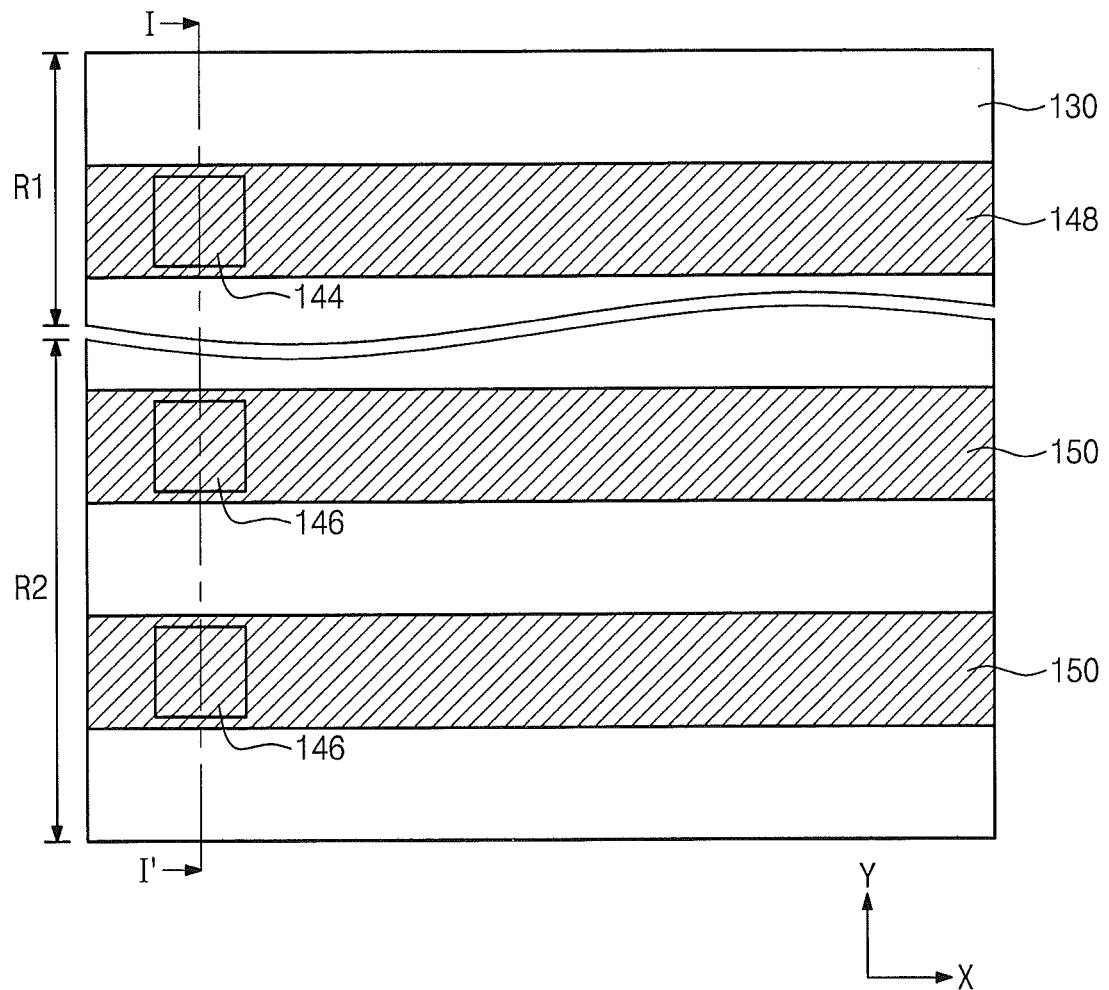
Figure 5B:
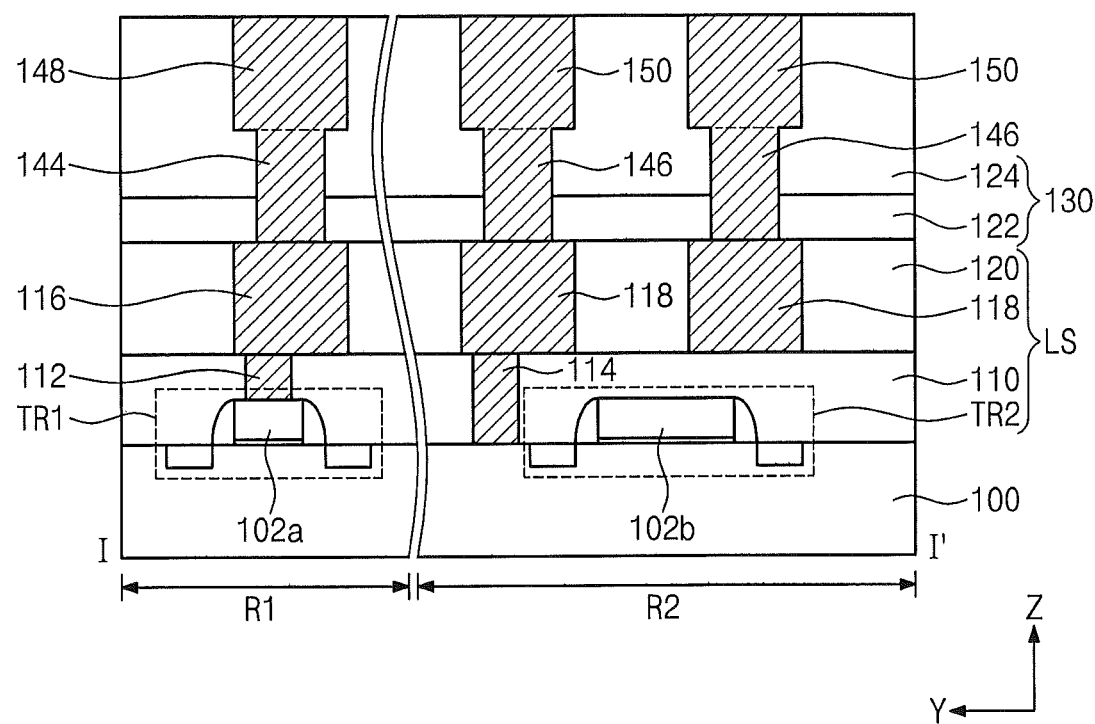

Referring to FIGS. 5A and 5B, a first middle contact 144 and a first middle interconnection 148 may be respectively formed in the first hole 132 and the first interconnection-trench 140, and a second middle contact 146 and a first portion 150 of a second middle inter connection may be respectively formed in the second hole 134 and the second interconnection-trench 142 (S20). The first middle contact 144 and the first middle interconnection 148 may be formed at the same time by a damascene process. The second middle contact 146 and the first portion 150 may also be formed at the same time by the damascene process. In other words, the first middle contact 144, the first middle interconnection 148, the second middle 146 and the first portion 150 may be formed at the same time. As illustrated in FIGS. 5A and 5B, a plurality of second middle contacts 146 and a plurality of first portions 150 may be formed in the second regions R2.

In more detail, a first conductive layer may be formed on the resultant structure described with reference to FIGS. 4A and 4B. The first conductive layer may be formed in, and in some embodiments to fill, the first hole 132, the first interconnection-trench 140, the second hole 134, and the second interconnection-trench 142. The first conductive layer may include a metal, a metal silicide, and/or a conductive metal nitride. In some embodiments, the first conductive layer may include copper (Cu). Subsequently, the first conductive layer may be planarized until the first interlayer insulating layer 130 is exposed, thereby forming the first middle contact 144, the first middle interconnection 148, the second middle contact 146 and the first portion 150 in the first hole 132, the first interconnection-trench 140, the second hole 134 and the second interconnection-trench 142, respectively. Thus, the first middle contact 144 and the first middle interconnection 148 may constitute one body without an interface therebetween, and the second middle contact 146 and the first portion 150 may also constitute one body without an interface therebetween. The first and second middle contacts 144 and 146 may be connected to the first and second lower interconnections 116 and 118, respectively.

Figure 6A:
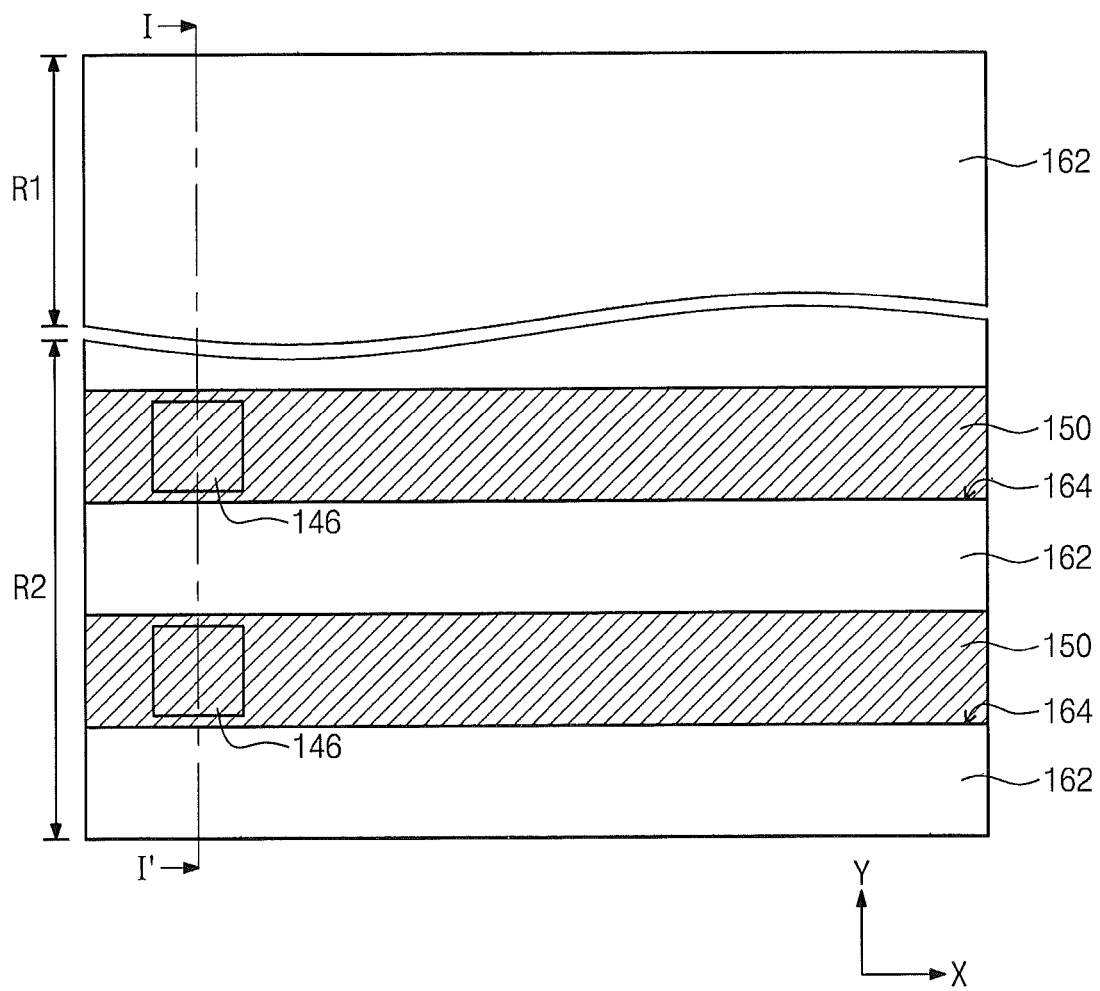
Figure 6B:
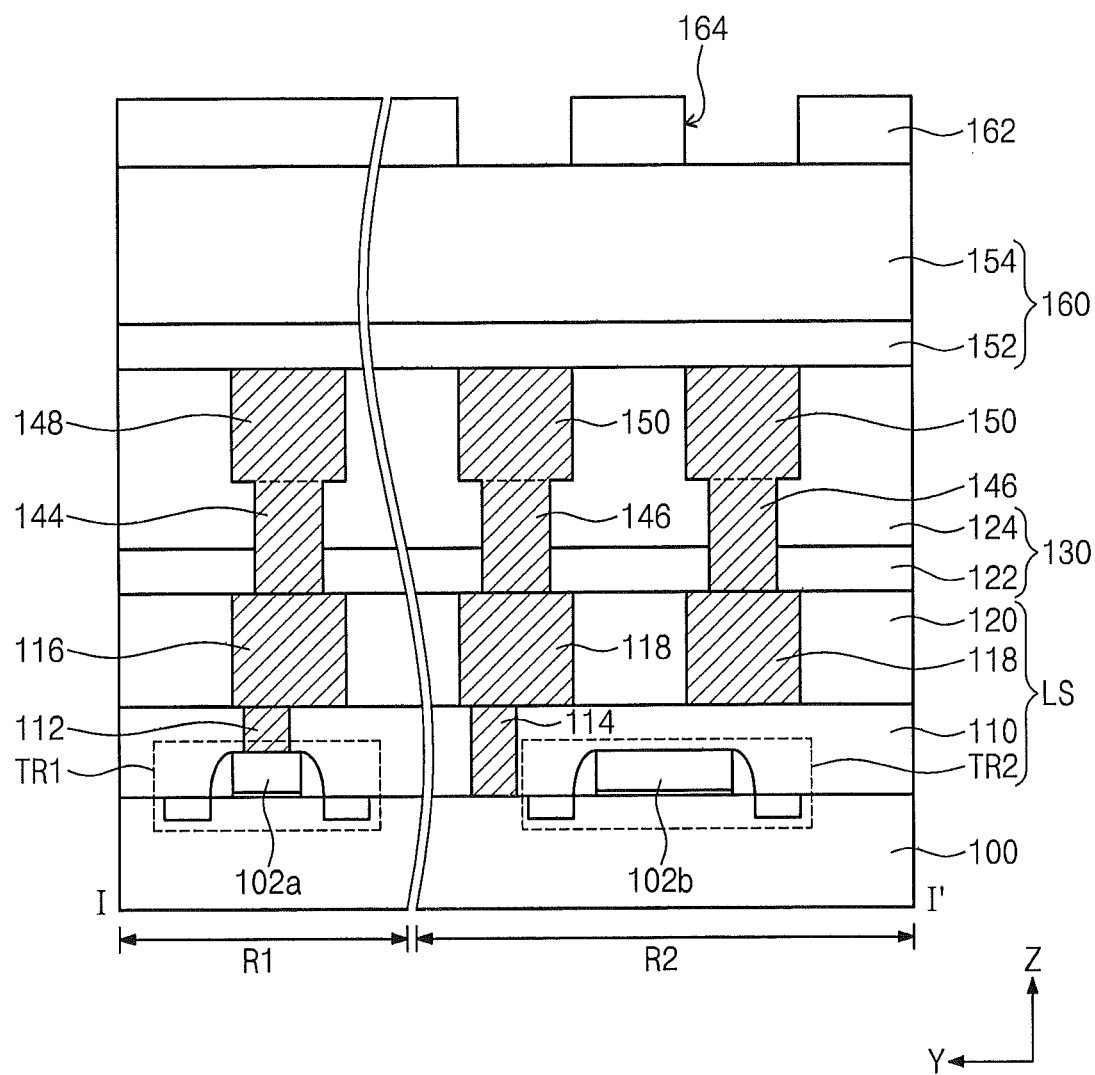

Referring to FIGS. 6A and 6B, a second interlayer insulating layer 160 may be formed on the resultant structure of FIGS. 5A and 5B (S30). The second interlayer insulating layer 160 may include a second etch stop layer 152 and a second mold layer 154 that are sequentially stacked. The second etch stop layer 152 may include a silicon nitride layer (e.g., a silicon-carbon nitride (SiCN) layer). The second mold layer 154 may include an oxide layer, a nitride layer, and/or an oxynitride layer. In some embodiments, the second mold layer 154 may include a SiCOH layer. A second mask pattern 162 having at least one second opening 164 may be formed on the second interlayer insulating layer 160. The second opening 164 define trench that will be formed in a subsequent process. The first region R1 may be covered by the second mask pattern 162. The second opening 164 may be formed in the second region R2. In the second region R2, the second opening 164 may have a linear shape extending in the second direction (e.g., the X-direction). The second opening 164 may expose the second interlayer insulating layer 160 on the first portions 150. In other words, the second opening 164 may vertically overlap with the first portion 150.

Figure 7A:
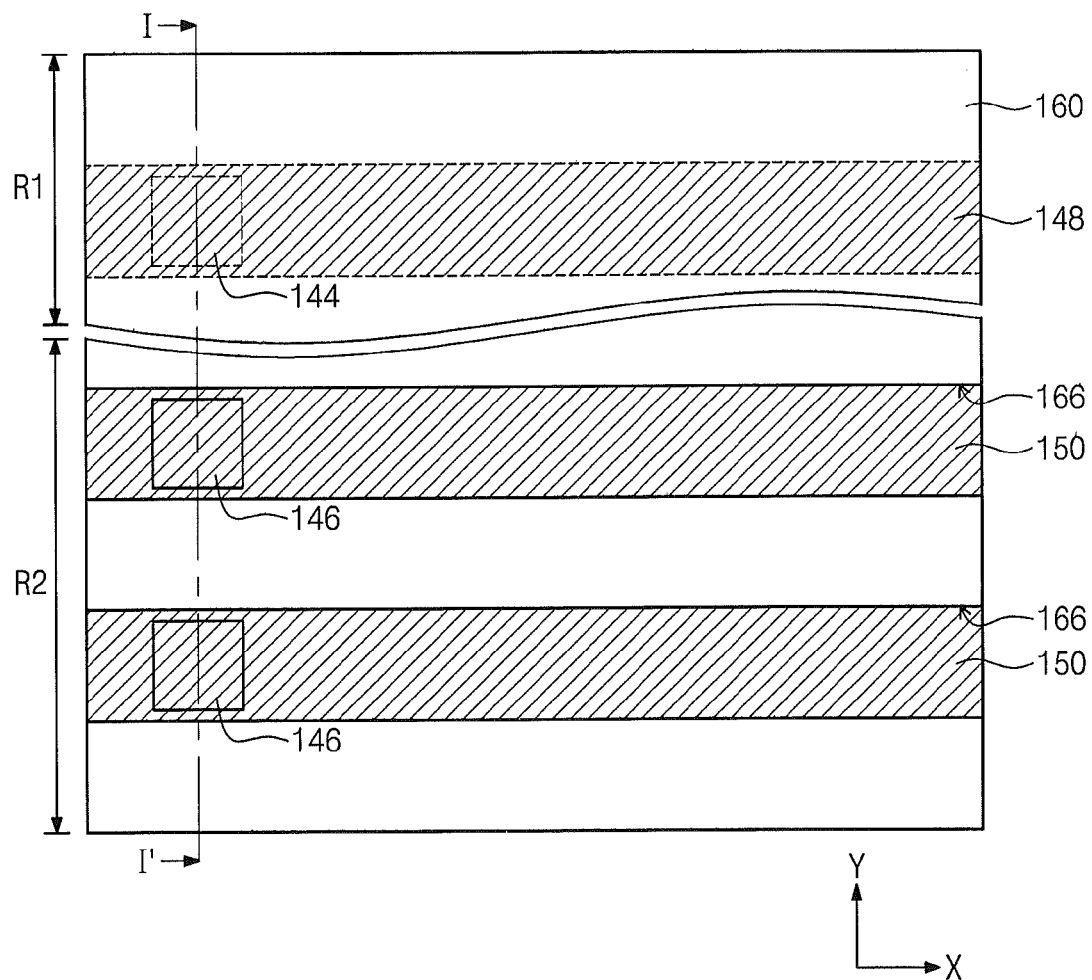
Figure 7B:
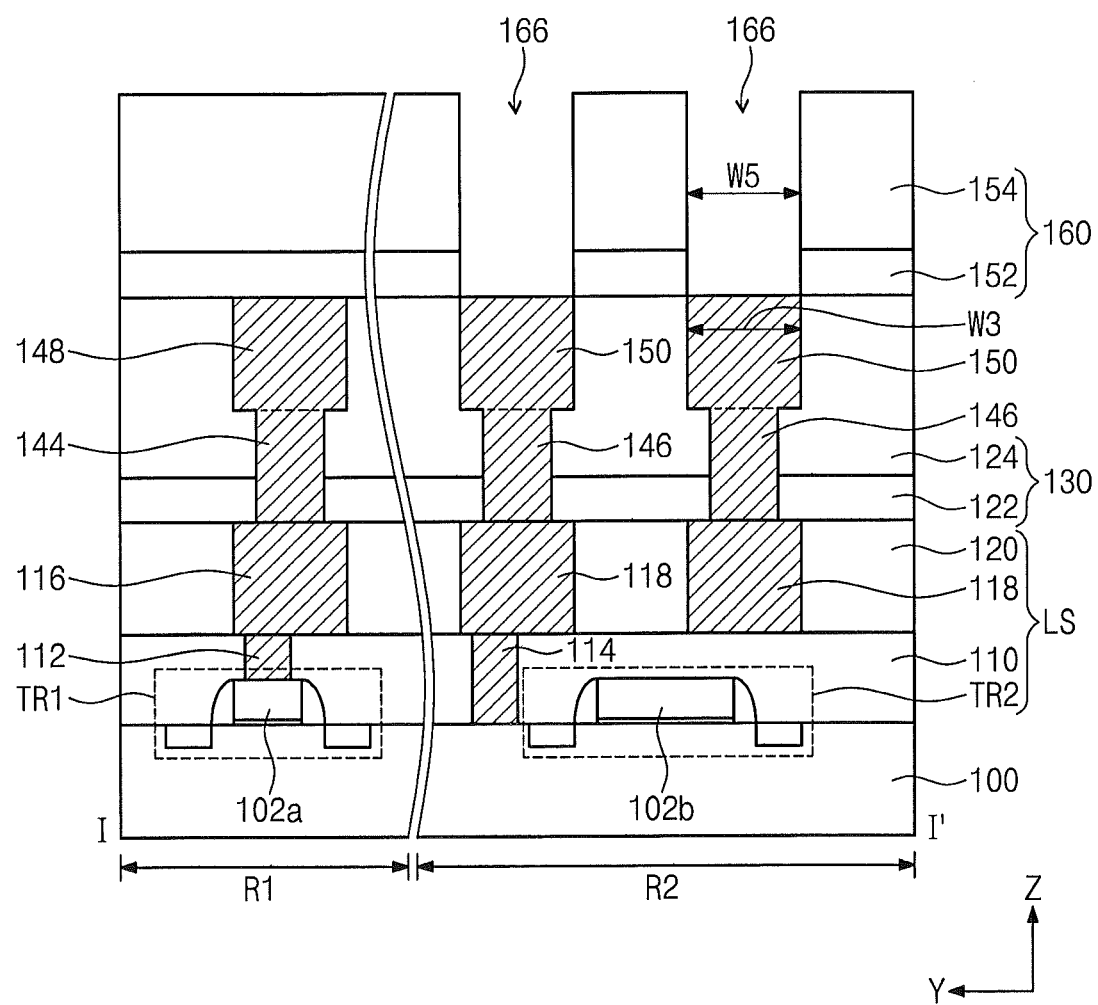

Referring to FIGS. 7A and 7B, the second interlayer insulating layer 160 may be etched using the second mask pattern 162 as an etch mask, thereby forming trench 166 exposing the first portion 150 (S40). The trench 166 may expose a top surface of the first portion 150. Additionally, the trench 166 may have a linear shape extending along the top surface of the first portion 150 in the second direction (e.g., the X-direction). In some embodiments, both sidewalls of the trench 166 may be aligned with both sidewalls of the first portion 150. Additionally, a width W5 of the trench 166 may be substantially equal to a width of the first portion 150 (i.e., the third width W3 of the second interconnection-trench 142). Thereafter, the second mask pattern 162 may be removed using an ashing process and/or a strip process.

Figure 8A:
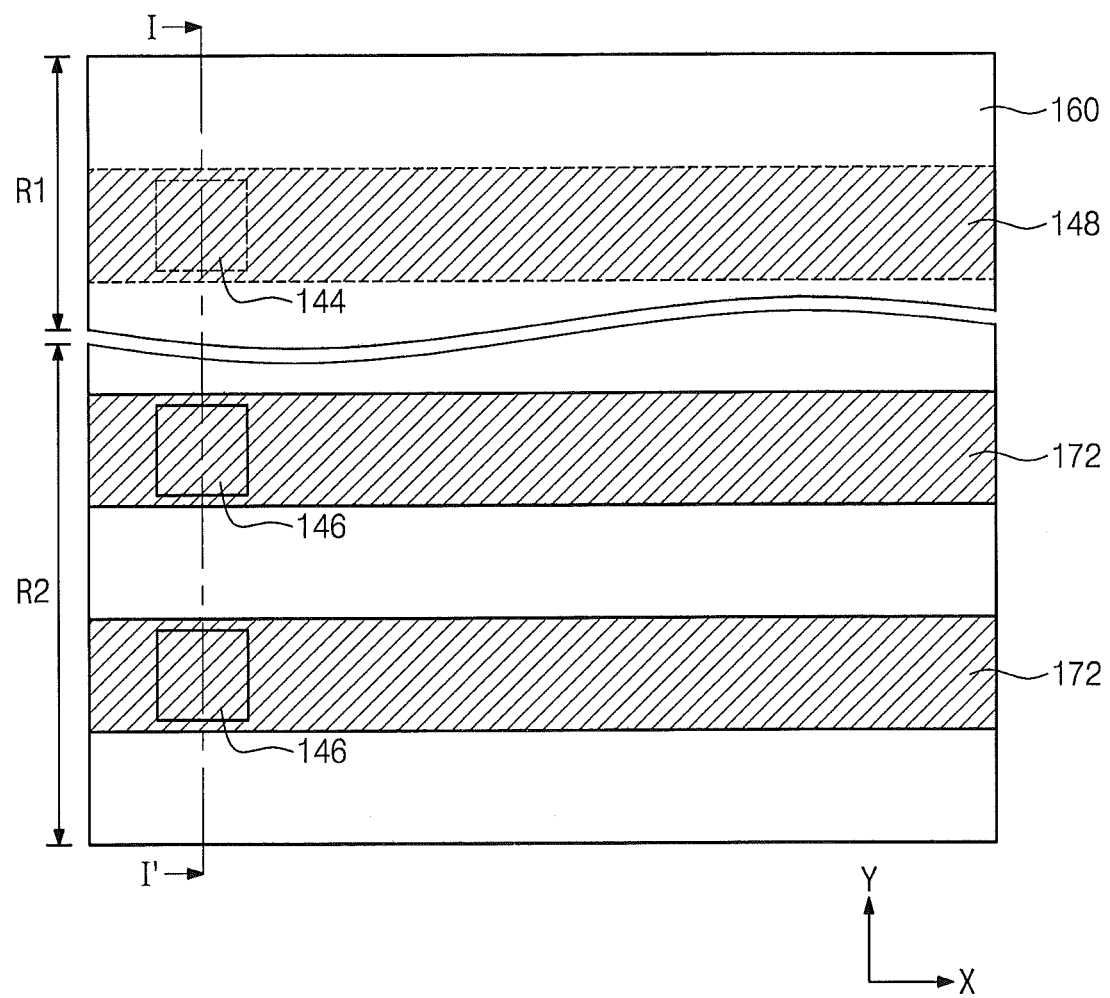
Figure 8B:
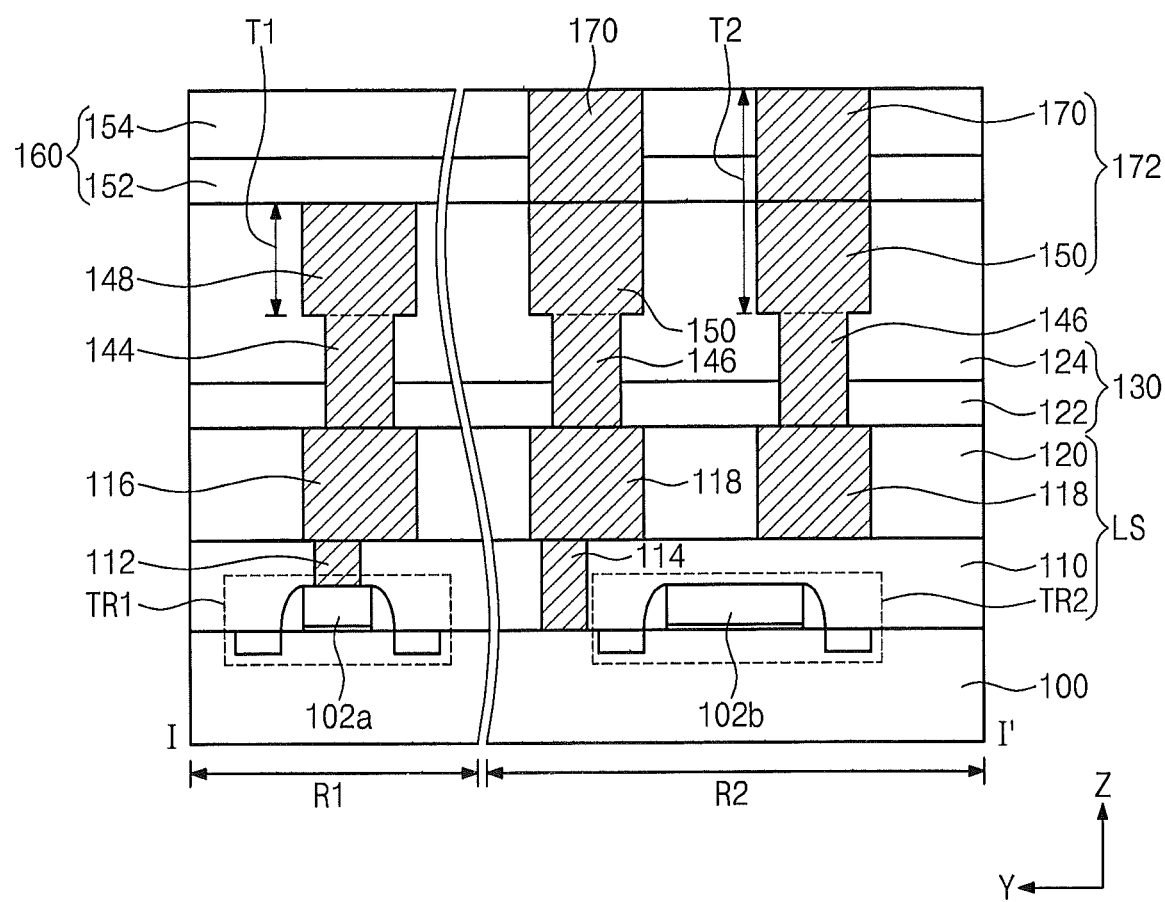

Referring to FIGS. 8A and 8B, a second conductive layer may be formed on the second interlayer insulating layer 160. The second conductive layer may be formed in, and in some embodiments may fill, the trench 166. The second conductive layer may include a metal, a metal silicide, and/or a conductive metal nitride. Subsequently, the second conductive layer may be planarized until the second interlayer insulating layer 160 is exposed, thereby forming a second portion 170 of the second middle interconnection in the trench 166 (S50). The second middle interconnection 172 may consist of the first portion 150 and the second portion 170 that are sequentially stacked.

The second portion 170 may include the same material as the first portion 150. For example, the first and second portions 150 and 170 may include copper (Cu). A bottom surface of the second portion 170 may be in contact with the top surface of the first portion 150.

A bottom surface of the first middle interconnection 148 may be disposed at a substantially same height as a bottom surface of the second middle interconnection 172. A top surface of the first middle interconnection 148 may be substantially coplanar with a top surface of the first interlayer insulating layer 130, and a top surface of the second middle interconnection 172 may be substantially coplanar with a top surface of the second interlayer insulating layer 160. Thus, the top surface of the second middle interconnection 172 may be higher than the top surface of the first middle interconnection 148.

A distance between the top surface and the bottom surface of the first middle interconnection 148 is defined as a first thickness T1, and a distance between the top surface and the bottom surface of the second middle interconnection 172 is defined as a second thickness T2. In this case, the second thickness T2 may be greater than the first thickness T1.

In some embodiments, if the semiconductor device according to the inventive concepts is realized as a mobile display driver integrated circuit, a power circuit and an analog circuit may be formed in the second region R2. According to embodiments of the inventive concepts, the second thickness T2 of the second middle interconnection 172 may be greater than the first thickness T1 of the first middle interconnection 148, so that the second middle interconnection 172 may have a lower resistance than the first middle interconnection 148. In other words, the second middle interconnection 172 having the low resistance may be selectively formed in the second region R2. Thus, electrical characteristics of the power and analog circuits in the second region R2 may be improved to realize the semiconductor device having excellent reliability.

Additionally, since the second middle interconnection 172 thicker than the first middle interconnection 148 may be selectively formed in the second region R2, additional contacts and additional interconnections for reducing interconnection-resistance may not be required in the second region R2. Thus, the semiconductor device having the improved electrical characteristics may be easily manufactured.

Figure 9A:
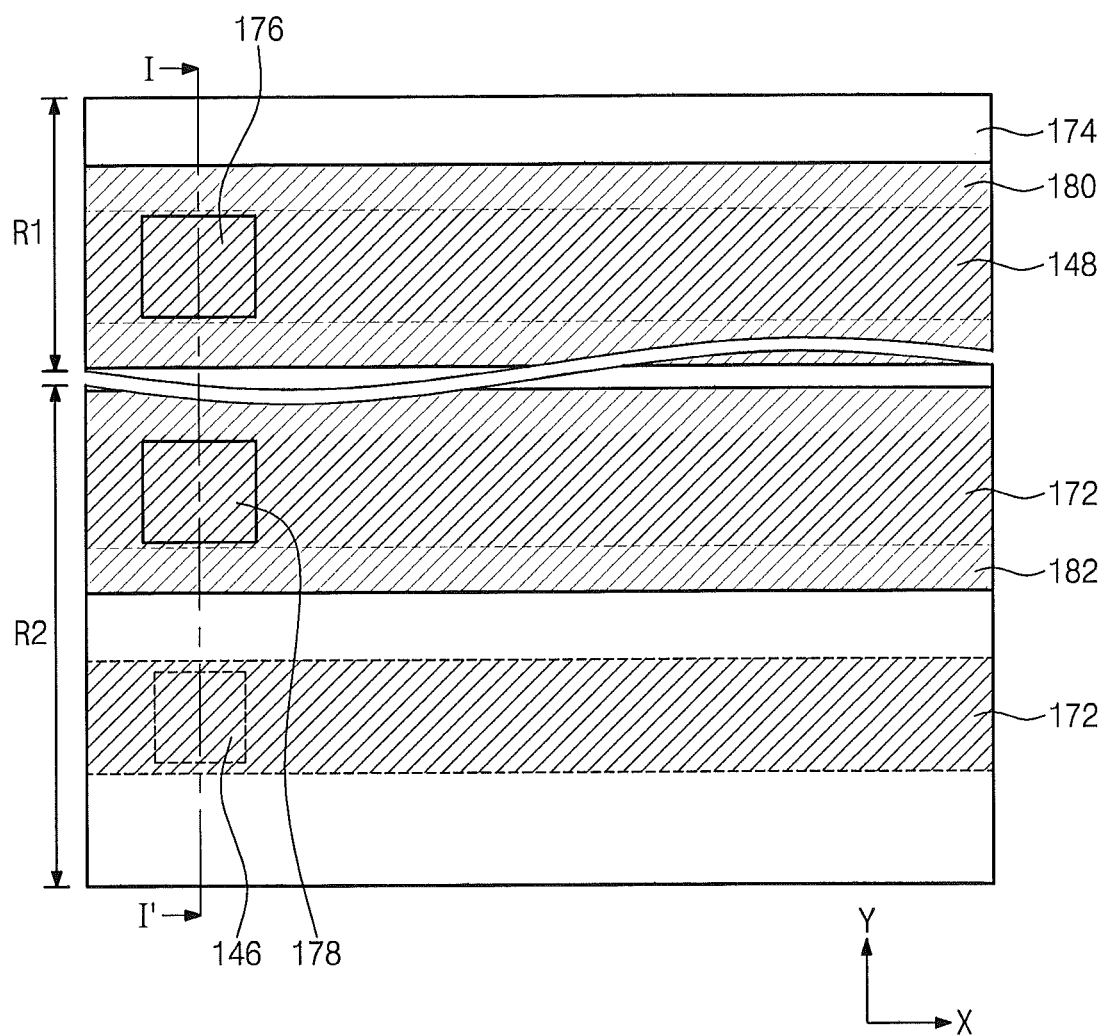
Figure 9B:
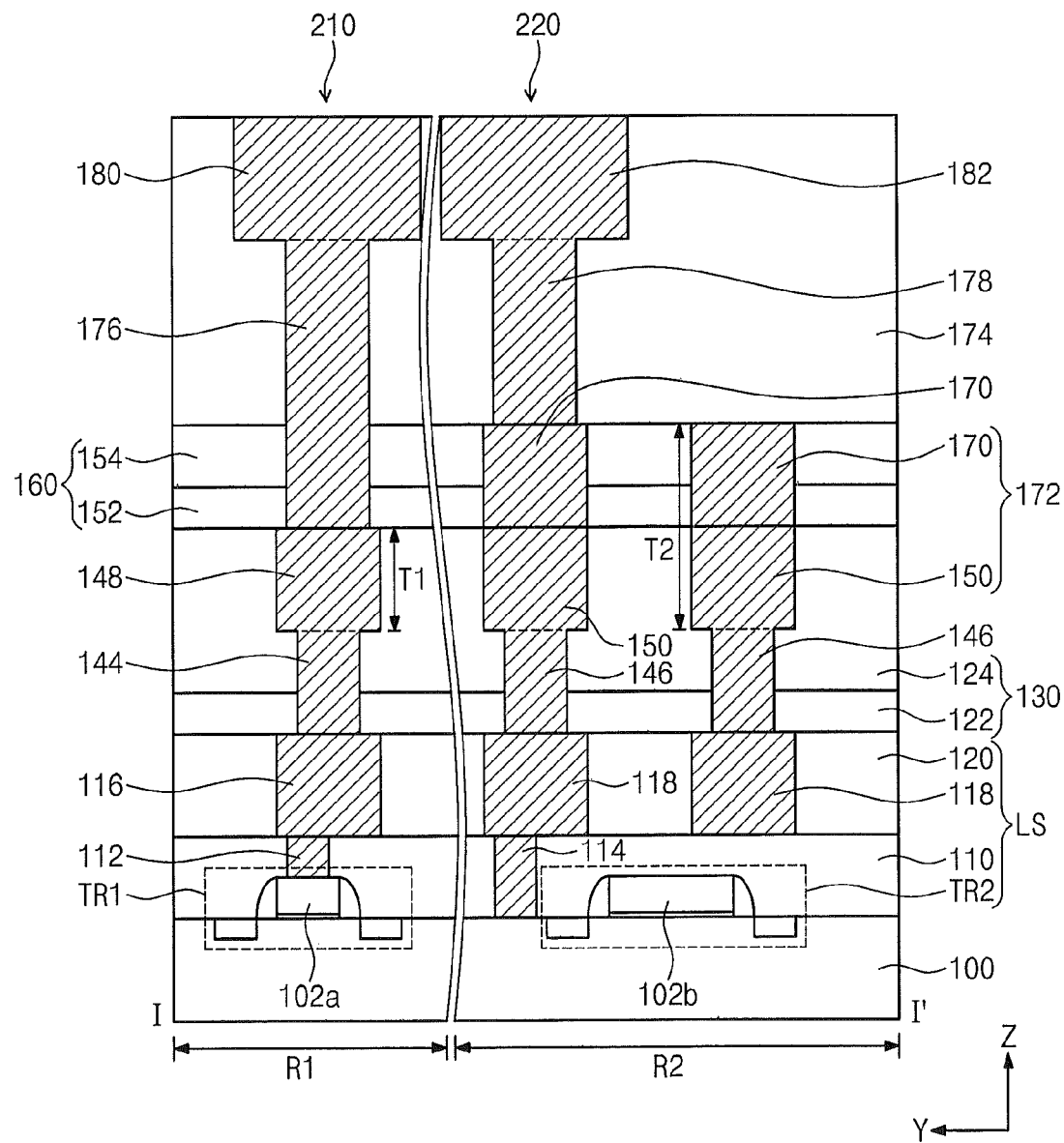

Referring to FIGS. 9A and 9B, a third interlayer insulating layer 174 may be formed on the resultant structure described with reference to FIGS. 8A and 8B. The third interlayer insulating layer 174 may include an oxide layer, a nitride layer, and/or an oxynitride layer. A first upper contact 176 and a first upper interconnection 180 may be formed in the third and second interlayer insulating layers 174 and 160 in the first region R1. The first upper contact 176 may penetrate a lower portion of the third interlayer insulating layer 174 and the second interlayer insulating layer 160. The first upper contact 176 may be in contact with the first middle interconnection 148. The first upper interconnection 180 may penetrate an upper portion of the third interlayer insulating layer 174 and may be connected to the first upper contact 176. The first upper contact 176 and the first upper interconnection 180 may include a metal, a metal silicide, and/or a conductive metal nitride. For example, the first upper contact 176 and the first upper interconnection 180 may include copper (Cu). A second upper contact 178 and a second upper interconnection 182 may be formed in the third interlayer insulating layer 174 in the second region R2. The second upper contact 178 may penetrate a lower portion of the third interlayer insulating layer 174 and may be in contact with at least one of the second middle interconnections 172. The second upper interconnection 182 may penetrate an upper portion of the third interlayer insulating layer 174 and may be connected to the second upper contact 178. The second upper contact 178 and the second upper interconnection 182 may include a metal, a metal silicide, and/or a conductive metal nitride. For example, the second upper contact 178 and the second upper interconnection 182 may include copper (Cu). Even though not shown in the drawings, the upper interconnections 180 and 182 may be electrically connected to an external display device. In some embodiments, the first upper contact 176 and the first upper interconnection 180 may constitute one body without an interface therebetween. The second upper contact 178 and the second upper interconnection 182 may constitute one body without an interface therebetween.

Next, structural features of the semiconductor device according to embodiments of the inventive concepts will be described with reference to FIGS. 9A and 9B.

Referring again to FIGS. 9A and 9B, a lower structure LS may be disposed on a substrate 100. The substrate 100 may include a first region R1 and a second region R2. Transistors driven by low driving voltage may be disposed in the first region R1. For example, the first region R1 may be a low voltage region. Transistors driven by relatively high driving voltage may be disposed in the second region R2. For example, the second region R2 may be a medium voltage region and/or a high voltage region. The lower structure LS may include transistors on the substrate 100, lower interconnections on the transistors, and lower contacts connecting the lower interconnections to the transistors and/or the substrate 100. The transistors may include a first transistor TR1 in the first region R1 and a second transistor TR2 in the second region R2. The first transistor TR1 may be driven by a lower driving voltage than the second transistor TR2. The lower interconnections may include a first lower interconnection 116 on the first transistor TR1 and a second lower interconnection 118 on the second transistor TR2. The lower contacts may include a first lower contact 112 electrically connecting the first transistor TR1 to the first lower interconnection 116, and a second lower contact 114 electrically connecting the substrate 100 to the second lower interconnection 118. However, unlike FIG. 9B, the first lower contact 112 may electrically connect the substrate 100 to the first lower interconnection 116, and/or the second lower contact 114 may electrically connect the second transistor TR2 to the second lower interconnection 118. The first lower contact 112 and the first lower interconnection 116 may be disposed in the first region R1. The second lower contact 114 and the second lower interconnection 118 may be disposed in the second region R2. Thus, connection of a lower contact 112, 114 to a transistor TR1, TR2 may be direct or indirect (for example, through the substrate 100).

A first interlayer insulating layer 130 may be disposed on the lower structure LS. A first middle contact 144 and a first middle interconnection 148 may be disposed in the first interlayer insulating layer 130 in the first region R1. The first middle contact 144 may penetrate a lower portion of the first interlayer insulating layer 130 to be connected to the first lower interconnection 116 in the first region R1. The first middle interconnection 148 may penetrate an upper portion of the first interlayer insulating layer 130 to be connected to the first middle contact 144. The first middle interconnection 148 may have a linear shape extending in the second direction (e.g., the X-direction) when viewed from a plan view. The first middle contact 144 and the first middle interconnection 148 may constitute one body without an interface therebetween and may include the same material. A second middle contact 146 and a first portion 150 of a second middle interconnection may be disposed in the first interlayer insulating layer 130 in the second region R2. The second middle contact 146 may penetrate a lower portion of the first interlayer insulating layer 130 to be connected to the second lower interconnection 118 in the second region R2. The first portion 150 of the second middle interconnection may penetrate an upper portion of the first interlayer insulating layer 130 to be connected to the second middle contact 146. The first portion 150 may have a linear shape extending in the second direction (e.g., the X-direction) when viewed from a plan view. The first middle interconnection 148 may be spaced apart from the first portion 150 in the first direction (e.g., the Y-direction). The second middle contact 146 and the first portion 150 may constitute one body without an interface therebetween and may include the same material.

A second interlayer insulating layer 160 may be disposed on the first interlayer insulating layer 130. A second portion 170 of the second middle interconnection may be disposed in the second interlayer insulating layer 160 in the second region R2. The second portion 170 may be connected to the first portion 150. The first and second portions 150 and 170 sequentially stacked may be defined as the second middle interconnection 172. A bottom surface of the second portion 170 may be in contact with a top surface of the first portion 150. The first and second portions 150 and 170 may include the same material.

A bottom surface of the first middle interconnection 148 may be disposed at a substantially same height as a bottom surface of the second middle interconnection 172. A top surface of the first middle interconnection 148 may be substantially coplanar with a top surface of the first interlayer insulating layer 130, and a top surface of the second middle interconnection 172 may be substantially coplanar with a top surface of the second interlayer insulating layer 160. Thus, the top surface of the second middle interconnection 172 may be higher than the top surface of the first middle interconnection 148. In other words, a thickness T2 of the second middle interconnection 172 may be greater than a thickness T1 of the first middle interconnection 148.

A third interlayer insulating layer 174 may be disposed on the second interlayer insulating layer 160. A first upper contact 176 may penetrate a lower portion of the third interlayer insulating layer 174 and the second interlayer insulating layer 160 in the first region R1. The first upper contact 176 may be connected to the first middle interconnection 148. A first upper interconnection 180 may penetrate an upper portion of the third interlayer insulating layer 174 and may be connected to the first upper contact 176 in the first region R1. The first upper interconnection 180 may have a linear shape extending in the second direction (e.g., the X-direction). In some embodiments, the first upper interconnection 180 may vertically overlap with the first middle interconnection 148. The first upper contact 176 and the first upper interconnection 180 may constitute one body without an interface therebetween and may include the same material.

A second upper contact 178 may penetrate a lower portion of the third interlayer insulating layer 174 and may be connected to the second middle interconnection 172 in the second region R2. A second upper interconnection 182 may penetrate an upper portion of the third interlayer insulating layer 174 and may be connected to the second upper contact 178 in the second region R2. The second upper interconnection 182 may have a linear shape extending in the second direction (e.g., the X-direction). The first upper interconnection 180 may be spaced apart from the second upper interconnection 182 in the first direction (e.g., the Y-direction). The second upper interconnection 182 may vertically overlap with the second middle interconnection 172. The second upper contact 178 and the second upper interconnection 182 may constitute one body without an interface therebetween and may include the same material.

According to embodiments of the inventive concepts, the thickness T2 of the second middle interconnection 172 is greater than the thickness T1 of the first middle interconnection 148. Thus, a resistance value of the second middle interconnection 172 may be lower than a resistance value of the first middle interconnection 148. In other words, the second middle interconnection 172 having the low resistance value may be selectively formed in the second region R2. As a result, electrical characteristics of a semiconductor circuit in the second region R2 may be improved to realize the semiconductor device having excellent reliability.

Additionally, the first and second middle interconnections 148 and 172 having different resistance values may be formed in the first and second regions R1 and R2, respectively. Thus, manufacturing processes of the semiconductor device with the improved electrical characteristics may be simplified.

FIGS. 9A and 9B also illustrate structural features of a semiconductor device according to other embodiments of the inventive concepts. Specifically, referring again to FIGS. 9A and 9B, a semiconductor device includes a substrate 100, a first interconnection structure 210 and a second interconnection structure 220 that both extend from adjacent the substrate 100 to remote from the substrate 100. The first and second interconnection structures 210, 220 each include a first portion 144, 146, respectively, adjacent the substrate 100, a second portion 176, 178, respectively, remote from the substrate, and an intermediate portion 148 and 150, 170, respectively, between the first and second portions. The intermediate portions 148 and 150, 170 of a respective interconnection structure 210, 220 are wider than the first portions 144, 146 and the second portions 176, 178 thereof, respectively. Moreover, the intermediate portion 148 of the first interconnection structure 210 is shorter than the intermediate portion 150, 170 of the second interconnection structure 220. Stated differently T1 is less than T2.

As also illustrated in FIGS. 9A and 9B, the first and second interconnection structures have substantially same height, which may be measured from the bottoms of first portions 144 and 146 to the tops of second portions 176 and 178.

Moreover, the first interconnection structure 210 is electrically connected to a first transistor TR1 and the second interconnection structure is electrically connected to a second transistor TR2 that operates at a higher voltage than the first transistor.

Moreover, FIG. 9B also illustrates various embodiments wherein the first portions 144, 146 are of substantially same width as one another, the second portions 176, 178 are of substantially same width as one another, and the intermediate portions 148 and 150, 170 are of substantially same width as one another. Finally, FIGS. 9A and 9B also illustrate various embodiments wherein the first and second interconnection structures 210 and 220 each further include a lower interconnection structure 116, 118, respectively, that extends between the respective first portions 144, 146 and the substrate 100. The lower interconnection structures 116, 118 are of substantially same width as one another and of substantially same width as the intermediate portions 148 and 150, 170, and of substantially same height as one another.

Figure 10:
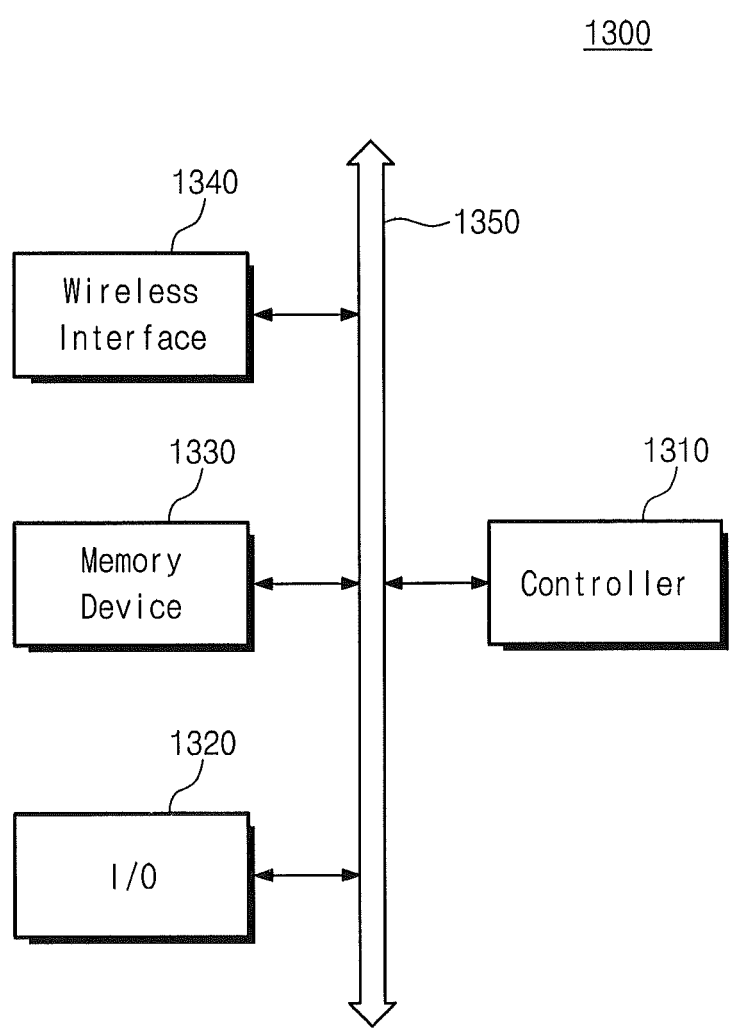
FIGS. 10 and 11 are schematic block diagrams illustrating electronic devices including semiconductor devices according to embodiments of the inventive concepts.
Figure 11:
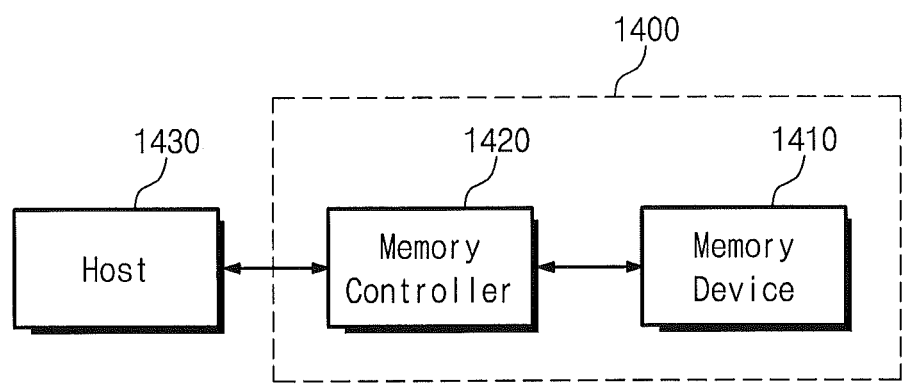

FIGS. 10 and 11 are schematic block diagrams illustrating electronic devices including semiconductor devices according to embodiments of the inventive concepts.

Referring to FIG. 10, an electronic device 1300 including a semiconductor device according to the inventive concepts may be one of a personal digital assistant (PDA), a laptop computer, a portable computer, a web tablet, a wireless phone, a mobile phone, a digital music player, a cable/wireless electronic device, or any composite electronic device including at least two thereof. The electronic device 1300 may include a controller 1310, an input/output (I/O) unit 1320 (e.g., a keypad, a keyboard, or a display), a memory device 1330, and a wireless interface unit 1340 that are coupled to each other through a data bus 1350. For example, the controller 1310 may include a microprocessor, a digital signal processor, a microcontroller, and/or another logic device. In some embodiments, any of the blocks of FIG. 10 may include at least one of the semiconductor devices according to the aforementioned embodiments of the inventive concepts. The memory device 1330 may store, for example, commands executed through the controller 1310. Additionally, the memory device 1330 may store user's data. The memory device 1330 may include at least one of the semiconductor devices in the aforementioned embodiments of the inventive concepts. The electronic device 1300 may use the wireless interface unit 1340 in order to transmit data to a wireless communication network communicating with a radio frequency (RF) signal or in order to receive data from the network. For example, the wireless interface unit 1340 may include antenna or a wireless transceiver. The electronic device 1300 may be used in a communication interface protocol of a communication system such as COMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced and/or MMDS.

Referring to FIG. 11, the semiconductor devices according to embodiments of the inventive concepts may be used in order to realize memory systems. A memory system 1400 may include a memory device 1410 and a memory controller 1420 for storing massive data. The memory controller 1420 may control the memory device 1410 in order to read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. Any of the blocks of FIG. 11 may include at least one of the semiconductor devices according to the above embodiments of the inventive concepts.

According to embodiments of the inventive concepts, the second middle interconnection in the second region may be thicker (taller) than the first middle interconnection in the first region. Thus, the second middle interconnection may have the resistance lower than that of the first middle interconnection. In other words, the second middle interconnection having the low resistance may be selectively formed in the second region to allow improved electrical characteristics of the semiconductor circuit in the second region. Thus, the semiconductor device having the excellent reliability may be realized.

Additionally, the first and second middle interconnections having different resistances from each other may be manufactured to simplify the manufacturing processes of the semiconductor device having the improved electrical characteristics.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a substrate including a first region and a second region;
a first interconnection on the substrate in the first region;
a second interconnection on the substrate in the second region;
a first interlayer insulating layer on the substrate;
a second interlayer insulating layer on the first interlayer insulating layer;
a first contact between the first interconnection and the substrate; and
a second contact between the second interconnection and the substrate,
wherein a bottom surface of the first interconnection is disposed at a substantially same height as a bottom surface of the second interconnection,
wherein a top surface of the second interconnection is higher than a top surface of the first interconnection,
wherein the first interconnection is electrically connected to a first transistor and the second interconnection is electrically connected to a second transistor that operates at a higher voltage than the first transistor,
wherein the top surface of the first interconnection is substantially coplanar with a top surface of the first interlayer insulating layer,
wherein the top surface of the second interconnection is substantially coplanar with a top surface of the second interlayer insulating layer,
wherein the second interconnection includes a first portion in the first interlayer insulating layer and a second portion in the second interlayer insulating layer,
wherein a top surface of the first portion is in contact with a bottom surface of the second portion,
wherein the first contact and the first interconnection constitute one body without an interface therebetween, and
wherein the second contact and the first portion of the second interconnection constitute one body without an interface therebetween.

2. A semiconductor device comprising:
a substrate;
a first interconnection structure and a second interconnection structure that both extend from adjacent the substrate to remote from the substrate;
the first and second interconnection structures each including a first portion adjacent the substrate, a second portion remote from the substrate and an intermediate portion between the first and second portions;
the intermediate portion of a respective interconnection structure being wider than the first and second portions thereof; and
the intermediate portion of the first interconnection structure being shorter than the intermediate portion of the second interconnection structure,
wherein the first interconnection structure is electrically connected to a first transistor and the second interconnection structure is electrically connected to a second transistor that operates at a higher voltage than the first transistor.

3. The semiconductor device of claim 2 wherein the first and second interconnection structures have a substantially same height.

4. The semiconductor device of claim 2 wherein the first portions are of a substantially same width as one another, the second portions are of a substantially same width as one another and the intermediate portions are of a substantially same width as one another.

5. The semiconductor device of claim 2 wherein the first and second interconnection structures each further includes a lower interconnection structure that extends between the respective first portions and the substrate, the lower interconnection structures being of a substantially same width as one another and of a substantially same width as the intermediate portions, and of a substantially same height as one another.

* * * * *